United States Patent

Numoto et al.

[11] Patent Number: 6,080,049
[45] Date of Patent: Jun. 27, 2000

[54] WAFER POLISHING APPARATUS

[75] Inventors: Minoru Numoto; Takao Inaba; Hisashi Terashita, all of Mitaka, Japan

[73] Assignee: Tokyo Seimitsu Co., Ltd., Tokyo, Japan

[21] Appl. No.: 09/131,689

[22] Filed: Aug. 10, 1998

[30] Foreign Application Priority Data

Aug. 11, 1997 [JP] Japan ................................... 9-216699

[51] Int. Cl.$^7$ ............................................. B24B 1/00
[52] U.S. Cl. .................... 451/285; 451/288; 451/287; 451/289; 451/290; 451/398
[58] Field of Search .................................. 451/289, 285, 451/287, 290, 398

[56] References Cited

U.S. PATENT DOCUMENTS 5,797,789  8/1998  Tanaka et al. .......................... 451/289

FOREIGN PATENT DOCUMENTS

| 0 786 310 | 7/1997 | European Pat. Off. . | |
| 8-150558 | 6/1996 | Japan . | |
| 08150558 | 11/1996 | Japan .............................. | B24B 37/04 |
| 8-339979 | 12/1996 | Japan . | |
| 9-66429 | 3/1997 | Japan . | |
| 09066429 | 11/1997 | Japan .............................. | B23Q 3/08 |

*Primary Examiner*—David A. Scherbel
*Assistant Examiner*—Shantese McDonald
*Attorney, Agent, or Firm*—Nixon Peabody LLP; David S. Safran

[57] ABSTRACT

The first air guide groove is formed at the bottom of a carrier along the inner circumference of a circle whose radius corresponds to the maximum radius of a wafer. The air is supplied to the outer periphery of the wafer through the first air guide groove to form a pressure air layer between the carrier and the wafer. The formation of the pressure air layer makes the air pressure applied to the wafer uniform on the entire surface of the wafer, and thus, the wafer can be polished under a uniform pressure force. The second air guide groove is formed along the inner circumference of a circle whose radius corresponds to the minimum radius of the wafer, and therefore, the wafer with an orientation flat or notch can be polished under a uniform pressure force.

14 Claims, 11 Drawing Sheets

F I G. 4
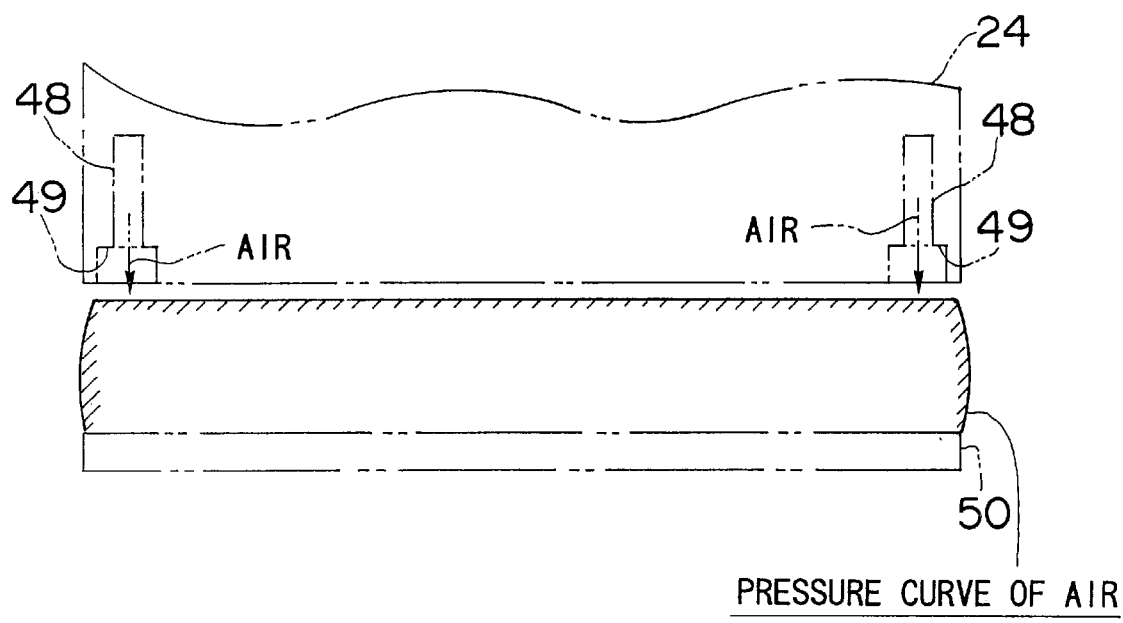
PRESSURE CURVE OF AIR

F I G. 8
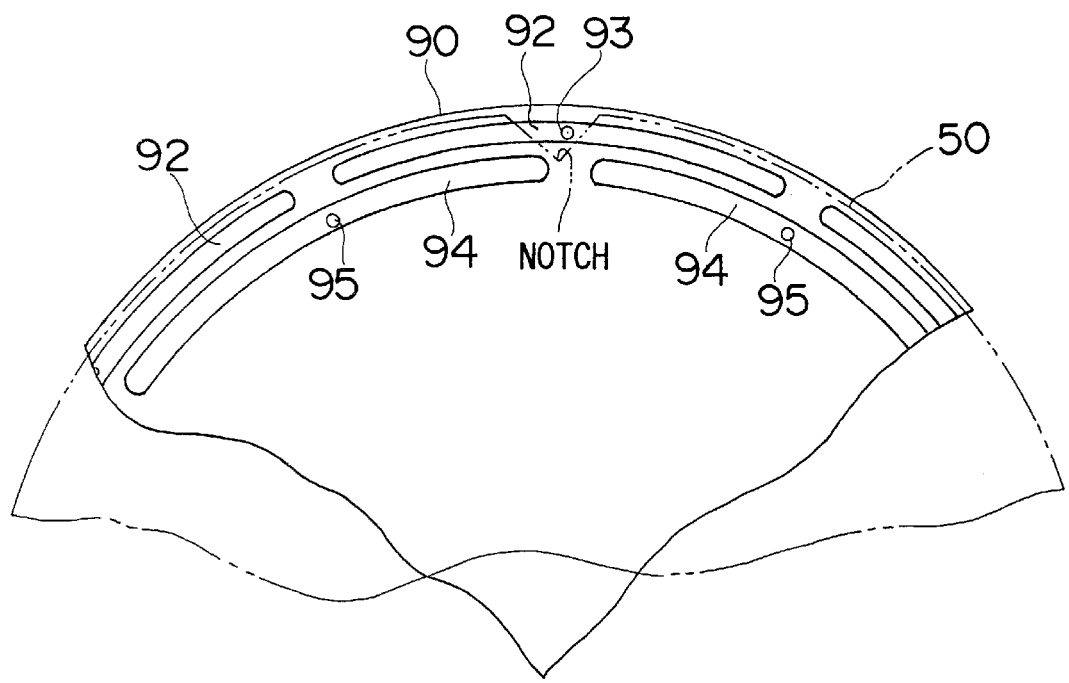

WAFER POLISHING APPARATUS

BACKGROUND OF THE INVENTION

1. Field of the Invention

The present invention relates generally to a wafer polishing apparatus, and more particularly to a wafer polishing apparatus which is used with a chemical mechanical polishing (CMP) method.

2. Description of Related Art

A wafer polishing apparatus disclosed in Japanese Patent Provisional Publication No. 8-339979 is provided with a holding head (a carrier), a polishing pad (a polishing cloth), and a seal member. A liquid supply passage is formed in the holding heads and a pressurized liquid is supplied into a space enclosed by the holding head, a substrate (a wafer) and the annular seal member through the liquid supply passage, and the substrate is polished while it is pressed against the polishing pad by the pressure of the pressurized liquid.

The liquid supply passage is formed coaxially with the rotary shaft of the holding head, and the pressurized liquid is jetted toward the center of the substrate through the liquid supply passage.

According to the above-described wafer polishing apparatus, the liquid supply passage is formed at such a position as to propel the pressurized liquid toward the center of the substrate. For this reason, the pressure of the pressurized liquid applied to the substrate becomes less as it moves farther from the center of the substrate. For this reason, the above-described wafer polishing apparatus cannot polish the substrate under a uniform pressure force.

SUMMARY OF THE INVENTION

The present invention has been developed in view of the above-described circumstances, and has as its object the provision of a wafer polishing apparatus which is capable of polishing the wafer under a uniform pressure force.

To achieve the above-mentioned object, the present invention is directed to a wafer polishing apparatus which has a plurality of air jetting holes in a carrier holding a wafer, jets the air from the plurality of air jetting holes to form a pressure air layer between the carrier and the wafer, and transmits a pressure force that is transmitted to the carrier from pressing means to the wafer through the pressure air layer, thereby polishing the wafer pressed against a polishing cloth, the wafer polishing apparatus wherein: the plurality of air jetting holes are formed at an outer periphery of a surface of the carrier, which faces to the wafer.

Moreover, to achieve the above-mentioned object, the present invention is directed to a wafer polishing apparatus which has a plurality of air jetting holes in a carrier holding a wafer, jets the air from the plurality of air jetting holes to form a pressure air layer between the carrier and the wafer, and transmits a pressure force that is transmitted to the carrier from pressing means to the wafer through the pressure air layer, thereby polishing the wafer pressed against a polishing cloth, the wafer polishing apparatus wherein: the air jetting holes connect with a porous member provided in the carrier, the porous member formed along the inner circumference of a circle whose radius corresponds to a radius of the wafer.

Furthermore, to achieve the above-mentioned object, the present invention is directed to a wafer polishing apparatus which presses a wafer against a rotating polishing cloth to polish a surface of the wafer, the wafer polishing apparatus comprising: a carrier for holding the wafer, a plurality of air jetting holes are formed at the outer periphery of the carrier, which faces to the wafer; first pressing means for pressing the carrier against the polishing cloth; pressure air layer forming means for jetting the air from the plurality of air jetting holes of the carrier to form a pressure air layer between the carrier and the wafer and transmitting a pressure force from the first pressing means to the wafer through the pressure air layer; a retainer ring enclosing the wafer to prevent the wafer from springing out of the carrier; a polished surface adjustment ring enclosing the wafer and coming into contact with the polishing cloth with the wafer; second pressing means for pressing the retainer ring and the polished surface adjustment ring against the polishing cloth; and stock removal detecting means for detecting a stock removal of the wafer.

According to the present invention, since a plurality of air jetting holes are formed at the outer periphery of the carrier, which faces to the wafer, and the air pressure applied to the wafer is uniform on the entire surface of the wafer. Thus, the wafer can be polished under the uniform pressure force.

According to the present invention, the air jetted from the air jetting holes are quickly supplied to the entire outer periphery of the wafer through the air guide grooves formed in the carrier to thereby form the pressure air layer. The supply of the air to the outer periphery of the wafer through the air guide grooves makes the air pressure applied to the wafer uniform on the entire surface of the wafer. Thus, the wafer can be polished under the uniform pressure force.

According to the present invention, the plurality of air jetting holes connect to respective air guide grooves. The number of air guide grooves is equal to that of air jetting holes.

According to the present invention, the air guide grooves are composed of the first air guide groove and the second air guide grooves. The first air guide groove is formed along the inner circumference of a circle whose radius corresponds to the maximum radius of the wafer, and the second air guide groove is formed along the inner circumference of a circle whose radius corresponds to the minimum radius of the wafer.

Since the first air guide grooves is formed along the inner circumference of a circle whose radius corresponds to the maximum radius of the wafer, the air pressure at the orientation flat or notch formed in the wafer would be reduced. Thus, the wafer cannot be pressed uniformly. To eliminate this disadvantage, the second air guide groove is formed along the inner circumference of the circle whose radius corresponds to the minimum radius of the wafer. The air guided through the second air guide groove is supplied to the entire periphery whose radius corresponds to the minimum radius of the wafer The formation of the second air guide groove makes it possible to supply the air into the orientation flat or the notch, and it is therefore possible to polish the wafer with the orientation flat or the notch under the uniform pressure force.

According to the present invention, the minimum radius of the wafer corresponds to the length of a perpendicular line from the center of the wafer to the orientation flat.

According to the present invention, the minimum radius of the wafer corresponds to the length from the center of the wafer to the notch.

According to the present invention, the first and second air guide grooves are composed of multiple divided grooves. Supplying the air through each air guide groove gives a restitutive force to the wafer, so that the tilting wafer can return to the original state. If the first air guide groove and the second air guide groove are formed alternately, the restitutive force can efficiently be given to the wafer.

According to the present invention, water jetting holes are formed in the carrier to propel the air toward the wafer. The water washes off the slurry and polishing dust adhered to the wafer. Since the slurry becomes solid when dried, the slurry is preferably washed off before drying, in other words, just after the completion of polishing.

According to the present invention, the water jetting holes serve as the air jetting holes, which eliminates the necessity for independently forming the water jetting holes.

According to the present invention, a vacuuming part, which vacuums the wafer, are formed inside the second air guide grooves. When the vacuuming parts vacuum the wafer, the air is jetted from the air jetting holes to prevent the dust outside the carrier from entering a space between the vacuuming part and the wafer.

According to the present invention, the air jetting holes connect with an air pump and a suction pump through a valve. Opening the air pump side and closing the suction pump side with the valve jets the air from the air jetting holes. Closing the air pump side and opening the suction pump side with the valve cause the air jetting holes to function as air suction holes which vacuum and hold the wafer. This eliminates the necessity for additionally providing a special vacuuming member.

According to the present invention, the porous member provided in the carrier connects to the air jetting holes, and the air is jetted through the porous member. If the air is jetted through the porous member, the air can uniformly be supplied to the periphery of the wafer.

According to the present invention, the air is jetted from a plurality of air jetting holes formed in the carrier to form a pressure air layer between the carrier and the wafer. A pressure force transmits from a first pressing means to the wafer through the pressure air layer to press the wafer against the polishing cloth. Even if there are foreign matters such as polishing dust between the carrier and the wafer, the pressure force can transmit from the first pressing means uniformly to the entire surface of the wafer. Thus, the entire surface of the wafer can be polished uniformly.

According to the present invention, a retainer ring prevents the wafer from springing out of the carrier. Moreover, there is provided a polished surface adjustment ring which comes into contact with the polishing cloth with the wafer, and a second pressing means adjusts a pressure force of the polished surface adjustment ring against the polishing cloth to prevent the polishing cloth from rising at the peripheral edge of the wafer. Thus, the pressure can uniformly be applied to the wafer from the polishing cloth, and the entire surface of the wafer can be polished uniformly. According to the present invention, a detecting means detects a stock removal of the wafer during polishing, so that an end point of the stock removal can be detected correctly.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 4 is a view of assistance in conceptionally explaining the distribution of the air pressure applied to the wafer;

FIG. 8 is a view showing a relation between a carrier in FIG. 6 and a wafer with a notch;

DETAILED DESCRIPTION OF THE PREFERRED EMBODIMENT

This invention will be explained in further detail by way of example with reference to the accompanying drawings.

Figure 1:
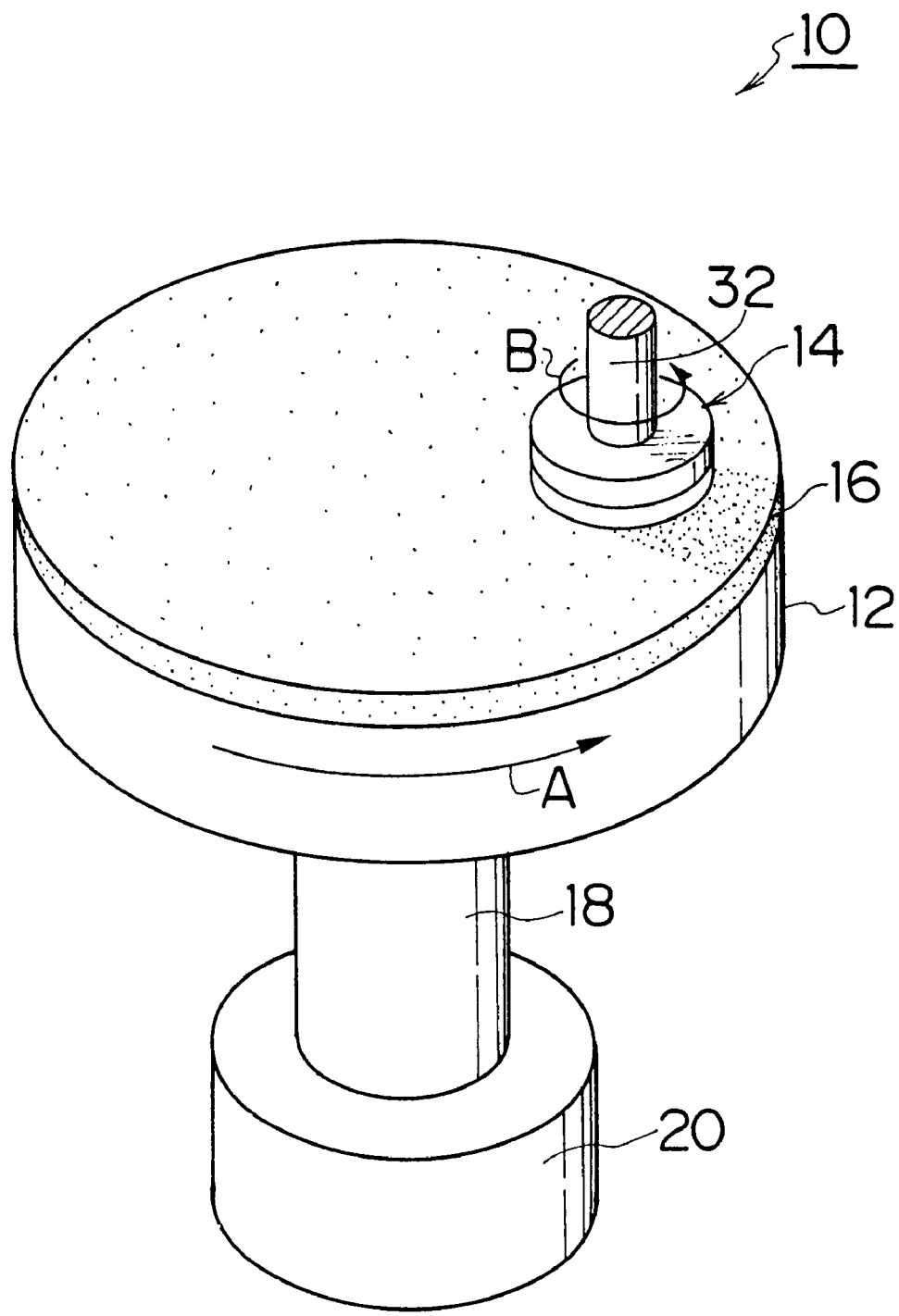
FIG. 1 is a view illustrating the entire structure of the wafer polishing apparatus according to the present invention.

FIG. 1 shows the entire structure of a wafer polishing apparatus according to the present invention.

As shown in FIG. 1, the wafer polishing apparatus 10 is comprised mainly of a turn table 12 and a wafer holding head 14. The turn table 12 is disc-shaped, and a polishing cloth 16 is attached on the top of the turn table 12. A spindle 18 connects to the bottom of the turn table 12 and an output shaft (not shown) of a motor 20. Driving the motor 20 rotates the turn table 12 in the direction indicated by an arrow A, and slurry is supplied onto the polishing cloth 16 of the rotating turn table 12 through a nozzle (not shown). A lifting apparatus (not shown) is capable of moving the wafer holding head 14 vertically. The wafer holding head 14 is moved up when a wafer subject for polishing is set in the wafer holding head 14, and the wafer holding head 14 is moved down and pressed against the polishing cloth 16 when the wafer is polished.

Figure 2:
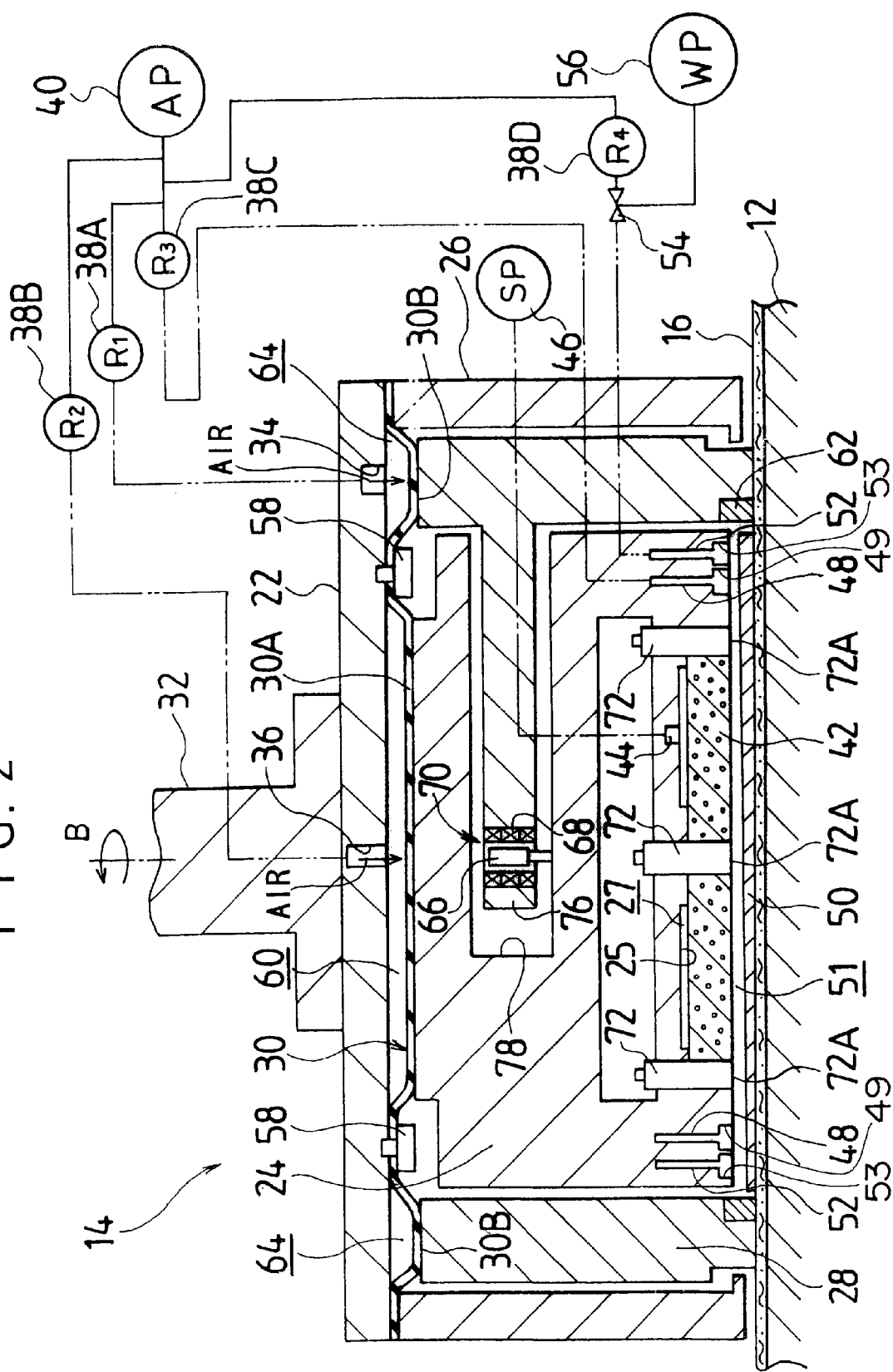
FIG. 2 is a longitudinal sectional view illustrating the first embodiment of a wafer holding head applied to the wafer polishing apparatus in FIG. 1.

FIG. 2 is a longitudinal sectional view of the wafer holding head 14. The wafer holding head 14 is comprised mainly of a head body 22, a carrier 24, a guide ring 26, a polished surface adjustment ring 28, and a rubber sheet 30. The head body 22 is disc-shaped, and a motor (not shown) connected to a rotary shaft 32 rotates the head body 22 in the direction indicated by an arrow B. Air supply passages 34, 36 are formed in the head body 22. The air supply passage 34 extends to the outside of the wafer holding head 14 as indicated by long and short alternate lines in FIG. 2. The air supply passage 34 connects to an air pump (AP) 40 via a regulator (R) 38A.I The air supply passage 36 connects to the air pump 40 via a regulator 38B.

The carrier 24 is shaped substantially like a column, and it is coaxially arranged below the head body 22. A concave 25 is formed at the bottom of the carrier 24, and the concave 25 contains a permeable porous board 42 (a vacuuming part). An air chamber 27 is formed over the porous board 42, and the air chamber 27 connects with an air suction passage 44 formed in the carrier 24. The air suction passage 44 extends to the outside of the wafer holding head 14 as indicated by long and short alternate lines in FIG. 2, and it connects to a suction pump (SP) 46. Driving the suction pump 46 causes the porous board 42 to vacuum the wafer 50 to the bottom thereof. The porous board 42 has a number of vent holes therein, and it is, for example, a sintered body of a ceramic material.

Figure 3:
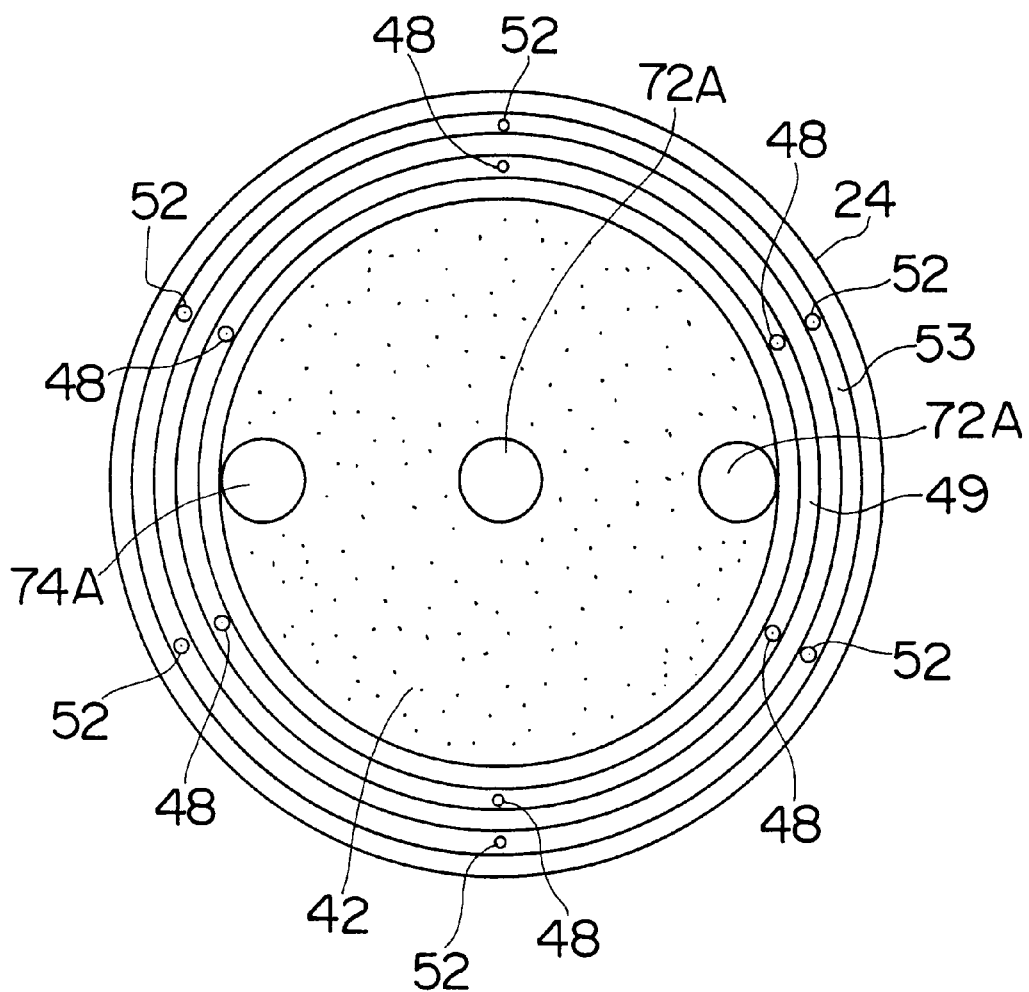
FIG. 3 is a bottom view of a carrier according to the first embodiment.

A number of air jetting holes 48, 48 . . . are formed in the bottom of the carrier 24 (FIG. 2 shows only two air jetting holes). As shown in FIG. 3, six air jetting holes 48 are formed at regular intervals. The air jetting holes 48 extend to the outside of the wafer holding head 14 as indicated by long and short alternate lines in FIG. 2, and the air jetting holes 48 connect to the air pump 40 via a regulator 38C. The compressed air is jetted from the air pump 40 to an air chamber 51 between the porous board 42 and the wafer 50 through the air jetting holes 48. This forms a pressure air layer in the air chamber 51, and therefore, the pressure force of the carrier 24 is transmitted to the wafer 50 through the pressure air layer. The wafer 50 is pressed against the polishing cloth 16 by the pressure force transmitted through the pressure air layer. The air jetted from the air jetting holes 48 is discharged to the outside through an outlet (not shown) formed in the polished surface adjustment ring 28.

As shown in FIGS. 2 and 3, the air jetting holes 48 connect with an air guide groove 49 formed at the bottom of the carrier 24. The air guide groove 49 with predetermined depth is formed along the inner circumference of a circle with the radius of the wafer 50. The air jetted from the air jetting holes 48 is supplied toward the entire outer periphery of the wafer 50 through the air guide groove 49. The air forms the previously-mentioned pressure air layer. The supply of the air to the outer periphery of the wafer 50 through the air guide groove 49 makes the air pressure applied to the wafer 50 uniform on the entire surface of the wafer 50 as shown in FIG. 4. Accordingly, the wafer 50 can be polished under a uniform pressure force.

A number of jetting holes 52 (FIG. 2 shows only two of them) are formed in the carrier 24. As shown in FIG. 3, six jetting holes 52 are formed at regular intervals. The jetting holes 52 extend to the outside of the wafer holding head 14 as indicated by long and short alternate lines in FIG. 2, and each jetting hole 52 is divided into two branches with the use of a valve 54. One branch connects to the air pump 40 through a regulator 38D, and the other branch connects to a water pump (WP) 56. If the valve 54 opens the branch at the air pump 40 side and closes the branch at the water pump 56 side, the compressed air is supplied from the air pump 40 to the air chamber 51 through the jetting holes 52. If the valve 54 is switched to close the branch at the air pump 40 side and opens the branch at the water pump 56 side, then the water is supplied from the water pump 56 to the air chamber 51 through the jetting holes 52.

As shown in FIGS. 2 and 3, the jetting holes 52 connect with a guide groove 53 formed at the bottom of the carrier. The guide groove 53 with predetermined depth is concentrically formed outside the guide groove 49. The water jetted from the jetting holes 52 is supplied toward the outer peripheral edge of the wafer 50 through the guide groove 53. The water washes off the slurry and polishing dust adhered to the edge of the wafer 50. Jetting the air through the jetting holes 52 dries the wafer 50 which has been washed by water.

A rubber sheet 30 is arranged between the carrier 24 and the head body 22. The rubber sheet 30 is a disc with a uniform thickness. The rubber sheet is fixed to the bottom of the head body 22 with support of an annular stopper 58. The rubber sheet is divided into a central part 30A and an outer peripheral part 30B with the stopper 58 being a boundary. The central part 30A of the rubber sheet 30 presses the carrier 24, and the outer peripheral part 30B presses the polished surface adjustment ring 28.

A space 60 is formed below the head body 22, and the space 60 is sealed by the central part 30A of the rubber sheet 30 and the stopper 58. The air supply passage 36 communicates with the space 60. When the compressed air is supplied into the space 60 through the air supply passage 36, the central part 30A of the rubber sheet 30 is elastically deformed under the air pressure to press the top of the carrier 24. Thus, the wafer is pressed against the polishing cloth 16. Adjusting the air pressure with the regulator 38B controls the pressure force (polishing pressure) of the wafer 50.

The cylindrical guide ring 26 is coaxially arranged below the head body 22. The guide ring 26 is fixed to the head body 22 through the rubber sheet 30. The polished surface adjustment ring 28 is arranged between the guide ring 26 and the carrier 24. A retainer ring 62 is attached to the inner periphery of the lower part of the polished surface adjusting ring 28 to prevent the wafer 50 from sprinting out.

An annular space 64 is formed at the lower outer periphery of the head body 22, and the space 64 is tightly closed by the head body 22, the outer peripheral part 30B of the rubber sheet 30, or the like. The air supply passage 34 connects with the space 64. When the compressed air is supplied into the space 64 through the air passage 34, the outer peripheral part 30B of the rubber sheet 30 is elastically deformed under the air pressure to press the annular top of the polished surface adjusting ring 28. This presses the annular bottom of the polished surface adjusting ring 28 against the polishing cloth 16. Adjusting the air pressure with the regulator 38A controls the pressure force of the polished surface adjustment ring 28.

As shown in FIG. 2, the wafer holding head 14 is provided with a stock removal detector which detects a stock removal of the wafer 50 in polishing. The stock removal detector consists of a sensor 70, which is composed of a core 66 and a bobbin 68, and non-contact sensors 72. A CPU (see FIG. 5) 74 is provided outside the wafer holding head 14, and the CPU 74 calculates a detected value which is detected by the sensors 70, 72.

The bobbin 68 of the sensor 70 is attached to the end of an arm 76 which extends toward a rotary shaft of the wafer holding head 14 from the inner surface of the polished surface adjustment ring 28. The core 66 of the sensor 70 is provided at such a position that a central axis of the core 66 is coaxial with the rotary shaft of the wafer holding head 14. The sensor 70 detects a vertical movement amount of the carrier 24 with respect to the bottom surface of the polished surface adjustment ring 28, in other words, with respect to the polished surface of the wafer 50. A groove 78 is formed in the carrier 24, and the arm 76 is inserted in the groove 78.

The sensor 70 is able to roughly detect the stock removal of the wafer 50. In this embodiment, however, the detected value detected by the sensor 70 is corrected by the detected values detected by the sensors 72 so as to obtain the correct stock removal of the wafer 50.

The sensor 72 is a non-contact sensor such as a capacity sensor, a detecting surface 72A of the sensor 72 is flush with the bottom of the porous board 42. The sensor 72 detects the distance from the detecting surface 72A to the top of the wafer 50 to thereby detect a variable in thickness of the pressure air layer in the air chamber 51.

Figure 5:
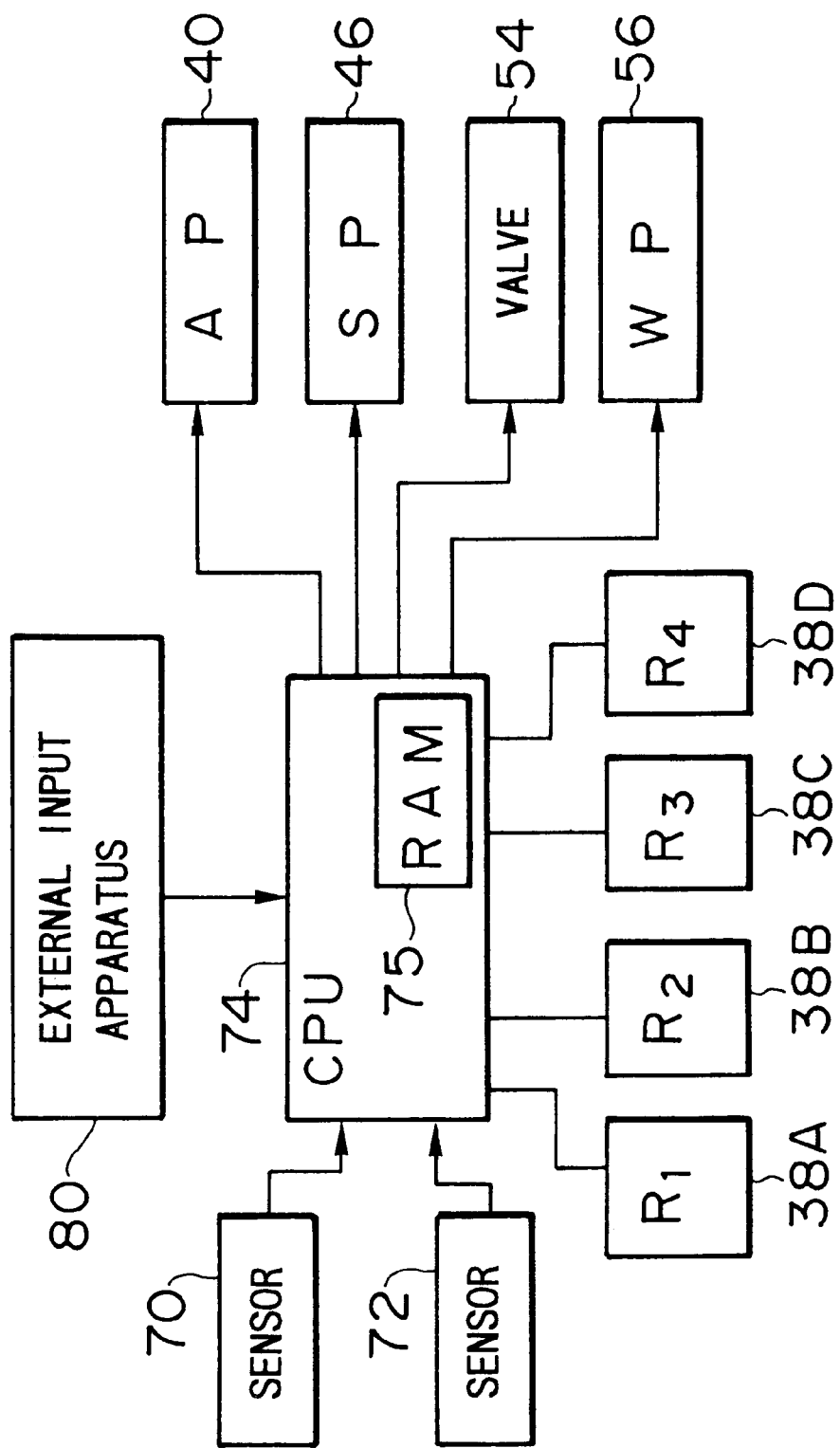
FIG. 5 is a block diagram illustrating a control system in the wafer polishing apparatus in FIG. 1.

The CPU 74 in FIG. 5, which generalizes and controls the wafer polishing apparatus, adds the variable in thickness of the pressure air layer detected by the sensors 72 to the movement amount of the carrier 24 detected by the sensor 70 to calculate the stock removal of the wafer 50. In other words, the CPU 74 calculates the stock removal of the wafer 50 from the variable and the movement amount with respect to a reference value which is previously stored in a RAM 75. For instance, if the movement amount detected by the sensor 70 is T1 and the average of the variables detected by the sensors 72 is T2, the stock removal of the wafer 50 is calculated in accordance with the equation T1+T2. If the movement amount detected by the sensor 70 is T1 and the average of the variables detected by the sensors 72 is 0, the stock removal of the wafer 50 is calculated in accordance with the equation T1+0. If the movement amount detected by the sensor 70 is T1 and the average of the variables detected by the sensors is −T2, the stock removal of the wafer 50 is calculated in accordance with the equation T1−T2. According to this embodiment, since the stock removal is calculated from the variable and the movement amount detected by the sensors 70, 72, it is possible to detect the stock removal of the wafer 50 correctly. Moreover, since the thickness of the wafer subject for polishing is found previously, it is also possible to detect a relation between the polished surface of the wafer 50 and a contact position of the polished surface adjustment ring 28 with respect to the polishing cloth 16. Thus, the pressure force of the polished surface adjustment ring 28 can be adjusted correctly.

A description will be given of the operation of the wafer polishing apparatus 10 which is constructed in the above-mentioned manner.

First, the wafer holding head 14 is moved up, and then the suction pump 46 is run to vacuum the wafer 50 subject for polishing to the porous board 42. Before the suction pump 46 is driven, the air is gently jetted from the air jetting holes 48, 52 to form an air curtain around the porous board 42 so as to prevent the dust outside the carrier from entering a space between the porous board 42 and the wafer 50.

Next, the wafer holding head 14 is moved down and stopped at a position where the contact surface 29 of the polished surface adjustment ring 28 contacts the polishing cloth 16. Then, the suction pump 46 is stopped to release the wafer 50, and the wafer 50 is placed on the polishing cloth 16.

Then, the air pump 40 is driven to supply the compressed air through the air jetting holes 48, and the compressed air is quickly supplied to the entire outer periphery of the wafer 50 through the air guide groove 49, thereby forming a pressure air layer in the air chamber 51. The supply of the air through the air guide groove 49 makes the air pressure applied to the wafer 50 uniform on the entire surface of the wafer 50 as shown in FIG. 4. Accordingly, the wafer 50 can be polished under a uniform pressure force.

Then, the compressed air is supplied from the air pump 40 to the space 60 through the air supply passage 36, and the central part 30A of the rubber sheet 30 is elastically deformed under the inner air pressure to press the carrier 24. The wafer 50 is pressed against the polishing cloth 16. The regulator 38B adjusts the air pressure to thereby keep constant the pressure force of the wafer 50 against the polishing cloth 16. The pressure force is set by means of the external input apparatus 80 in FIG. 5.

The compressed air is supplied from the air pump 40 into the space 64 through the air supply passage 34, and the outer peripheral part 30B of the rubber sheet 30 is elastically deformed under the inner air pressure to press the polished surface adjustment ring 28. Thus, the bottoms of the polished surface adjustment ring 28 and the retainer ring 62 are pressed against the polishing cloth 16 at the same time. Then, the turn table 12 and the wafer holding head 14 are rotated to start polishing the wafer 50.

The sensors 70, 72 and the CPU 74 calculate the stock removal of the wafer 50 during the polishing. When the calculated stock removal reaches a preset target value, the CPU 74 outputs a polishing end signal to stop the wafer polishing apparatus 80, and the polishing of the first wafer 50 is completed.

After the polishing is completed, the water is jetted from the jetting holes 52 to wash off the slurry and the polishing dust adhered to the wafer 50. After washing, the air is jetted from the jetting holes 52 to dry the wafer 50, and the polishing of the first wafer 50 is completed. The above-described steps are repeated to polish the subsequent wafers 50.

As stated above, in this embodiment, the air guide groove 49 is formed in an area corresponding to the outer periphery of the wafer 50, and the compressed air is supplied through the air guide groove 49. For this reason, the wafer 50 can be polished under the uniform pressure force.

When the air guide groove 49 is not formed, the same effects can be achieved if the air jetting holes 48 are densely formed in an area corresponding to the outer periphery of the wafer 50.

Figure 6:
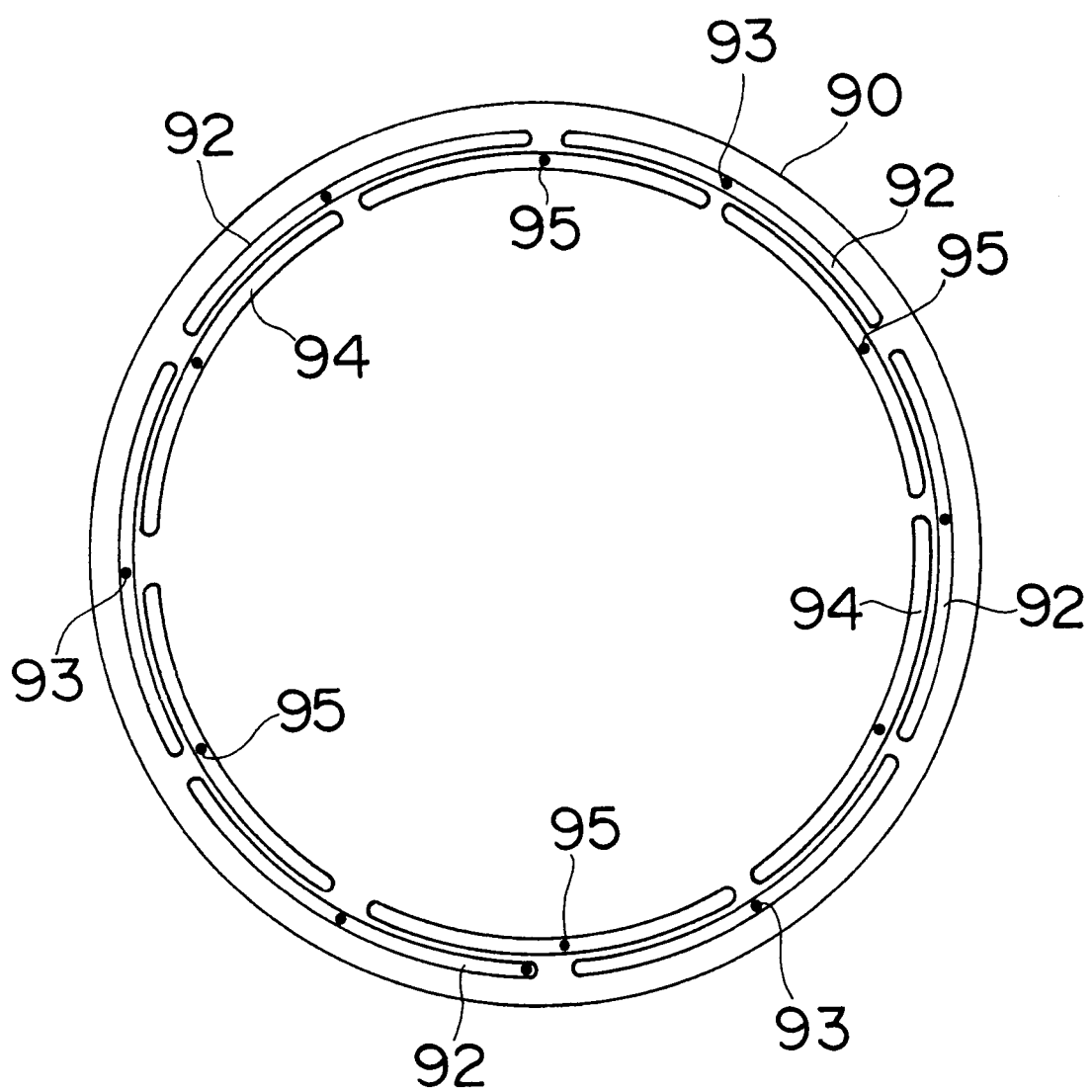
FIG. 6 is a bottom view of a carrier according to the second embodiment.

FIG. 6 is a bottom view illustrating the second embodiment of a carrier 90 applied to the wafer holding head 14.

A plurality of first air guide grooves 92 and a plurality of second air guide grooves 94 are formed at the bottom of the carrier 90. Air jetting holes 93 connect with the center of the respective first air guide grooves 92, and air jetting holes 95 connect with the center of the respective second air guide grooves 94. The first air guide groove 92 and the second air guide groove 94 are formed alternately.

The first air guide grooves are formed along the inner circumference of a circle whose radius corresponds to the maximum radius of the wafer. The air jetted from the air jetting holes 93 is quickly supplied to the outer periphery of the wafer through the first guide grooves 92, and the air forms a pressure air layer. Thus, the wafer can be polished under the uniform pressure force.

The first air guide grooves 92 are formed along a circle whose radius corresponds to the maximum radius of the wafer. If the orientation flat or notch is formed in the wafer, the air pressure at the orientation flat or notch becomes less. Thus, the wafer cannot be pressed uniformly.

Figure 7:
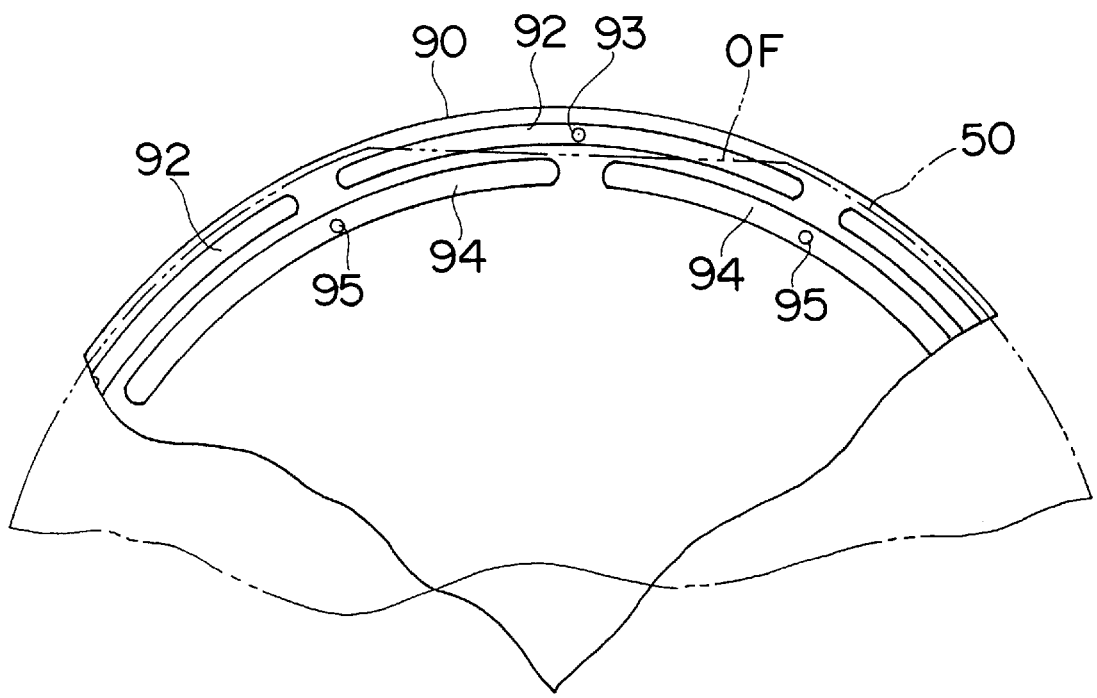
FIG. 7 is a view showing a relation between a carrier in FIG. 6 and a wafer with an orientation flat.

To eliminate the above-mentioned disadvantage, the second air guide grooves 94 are formed along the inner circumference of circle whose radius corresponds to the minimum radius of the wafer. When the air is jetted from the jetting holes 95, the air is supplied to the entire periphery whose radius corresponds to the minimum radius of the wafer through the second air guide grooves 94, and the air forms a pressure air layer. The formation of the second air guide grooves 94 supplies the air to the inside of the orientation flat (OF) indicated by long and two short alternate lines in FIG. 7 or the notch indicated by long and two short alternate lines in FIG. 8. Thus, the wafer 50 with the orientation flat or notch can be polished under the uniform pressure force.

The above-mentioned minimum radius of the wafer corresponds to the length of a perpendicular line from the center of the wafer to the orientation flat. In the case of the notch, the minimum radius of the wafer corresponds to the length from the center of the wafer to the notch.

On the other hand, there are formed a plurality of first air guide grooves 92 and second air guide grooves 94 in the carrier 90 in FIG. 6, the supply of the air through the air guide grooves 92, 94 gives the wafer a restitutive force for restoring the tilting wafer to the original state. Since the first air guide groove 92 and the second air guide groove 94 are formed alternately, the restitutive force can be given efficiently to the wafer.

Figure 9:
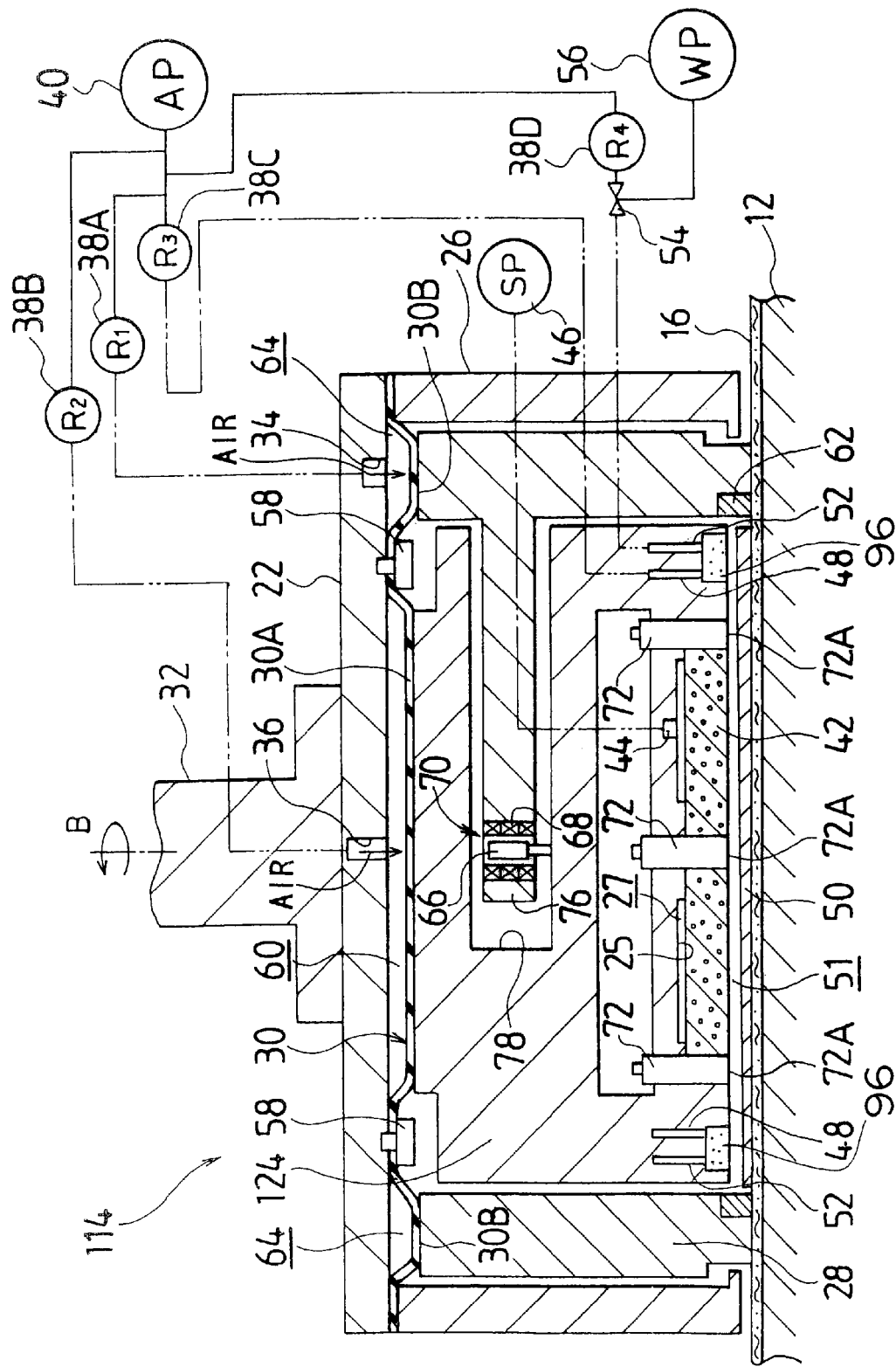
FIG. 9 is a longitudinal sectional view of a wafer holding head according to the second embodiment.

FIG. 9 is a longitudinal sectional view of the wafer holding head 114 according to the second embodiment. Parts similar to those of the wafer holding head 14 of the first embodiment in FIG. 2 will be designated by the same reference numerals, and they will not be explained.

Figure 10:
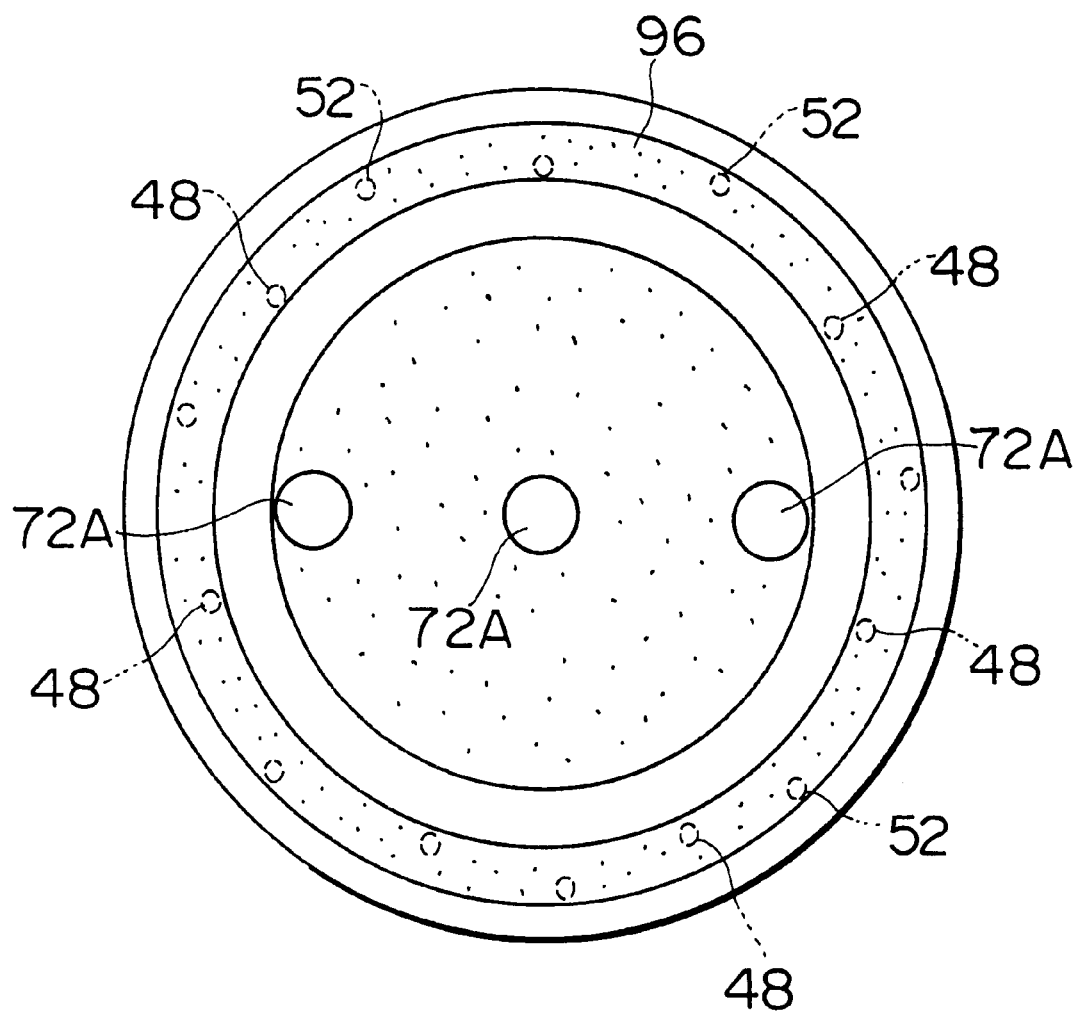
FIG. 10 is a bottom view illustrating a carrier of a wafer holding head in FIG. 9.

An annular porous member 96 in FIG. 10 is arranged at the bottom of the carrier 124 of the wafer holding head 114 in such a way as to face to the periphery of the wafer 50. As shown in FIG. 9, the porous member 96 connects with the air jetting holes 48, 52. The air jetted from the air jetting holes 48, 52 are jetted toward the periphery of the wafer 50 through the porous member 96. If the porous member 96 is applied instead of the air guide grooves as is the case with the wafer holding head 114 of this embodiment, the air can be supplied uniformly to the periphery of the wafer 50.

Figure 11:
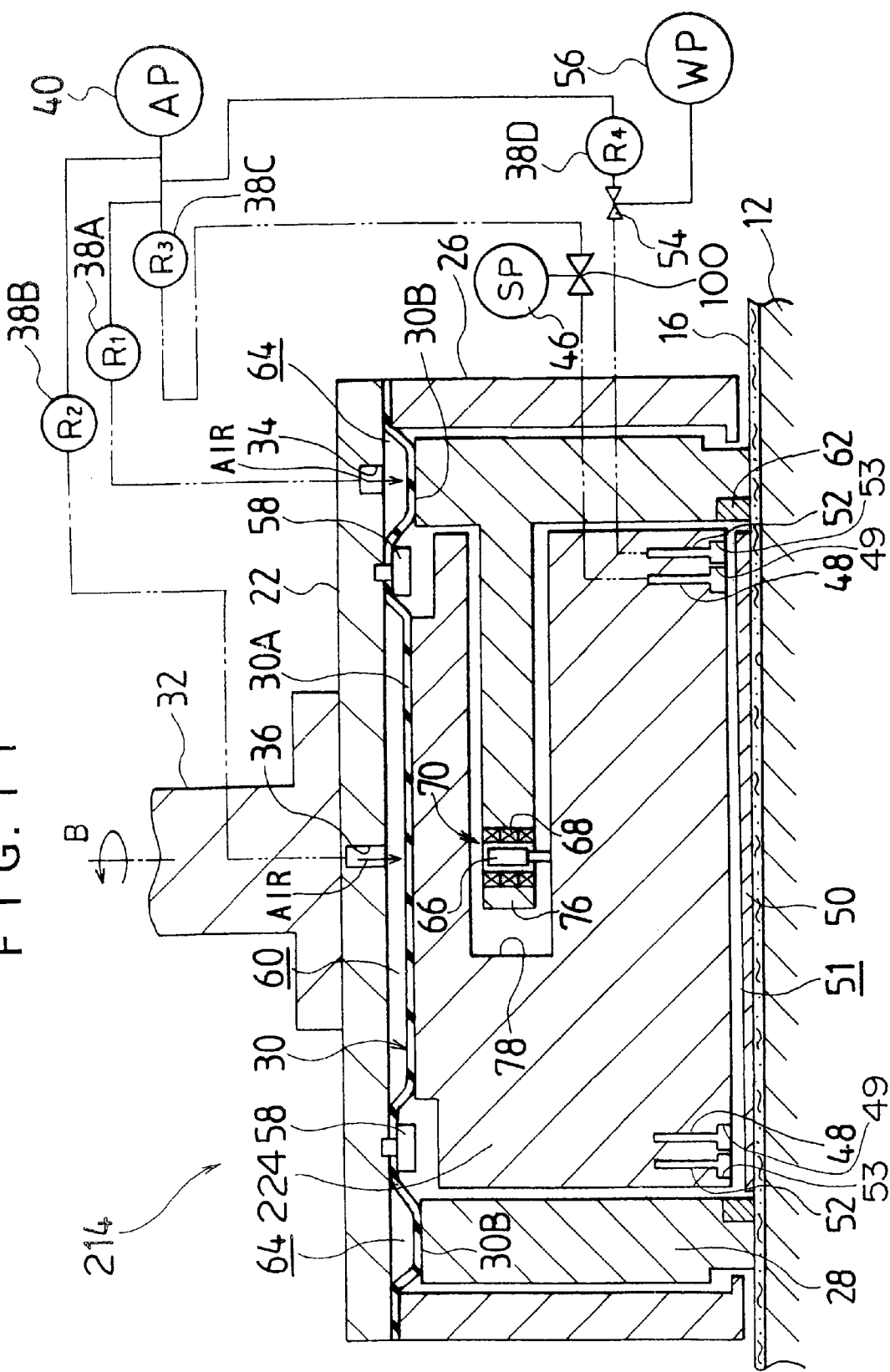
FIG. 11 is a longitudinal sectional view illustrating a wafer holding head according to the third embodiment.

FIG. 11 is a longitudinal sectional view of a wafer holding head 214 according to the third embodiment. Parts similar to those of the wafer holding head 14 according to the first embodiment in FIG. 2 are designated by the same reference numerals, and they will not be explained.

The wafer holding head 214 is constructed in such a way that the air jetting holes 48, which are formed in a carrier 224, connect to the air pump 40 and the suction pump 46 with support of a valve 100. Opening the branch at the air pump 40 side and closing the branch at the suction pump 46 side with the valve 100 jets the air from the air pump 40 through the jetting holes 48. On the other hand, closing the branch at the air pump 40 side and opening the branch at the suction pump 46 side with the valve 100 causes the air jetting holes 48 to function as air suction holes which vacuum and hold the wafer 50. The use of the air jetting holes 48 for vacuuming eliminates the necessity for providing a carrier 224 with a special suction member (a porous member) for vacuuming the wafer 50. Likewise, the air jetting holes 52 connect with the air pump 40 and the suction pump 46 through a valve, so that the air jetting holes 52 can be switched for jetting the air and vacuuming the wafer 50.

As set forth hereinabove, according to the wafer polishing apparatus of the present invention, a plurality of air jetting holes are formed at the outer periphery of the carrier, which faces to the wafer. Thus, the wafer can be polished under the uniform pressure force.

According to the present invention, the air jetted from the air jetting holes is supplied to the outer periphery of the wafer through the first air guide groove which is formed along the circle whose radius corresponds to the maximum radius of the wafer. Thus, the wafer can be polished under the uniform pressure force.

Furthermore, according to the present invention, the second air guide grooves is formed along the circle whose radius corresponds to the minimum radius of the wafer. The air is jetted toward the periphery of the wafer through the second air guide groove, and therefore, the wafer with the orientation flat or notch can be polished under the uniform pressure.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer polishing apparatus comprising a carrier holding a wafer, pressing means for applying a pressure force to the carrier holding the wafer, a plurality of air jetting holes in the carrier holding the wafer, air from said plurality of air jetting holes forming a pressure air layer between said carrier and said wafer and transmitting said pressure force, that is transmitted to said carrier from said pressing means, directly to said wafer through said pressure air layer, thereby polishing said wafer by pressing the wafer against a polishing cloth, wherein:

said plurality of air jetting holes are formed at an outer periphery of a surface of said carrier which faces toward said wafer.

2. The wafer polishing apparatus as defined in claim 1, wherein said plurality of air jetting holes connect to one another through an air guide groove formed in said surface of said carrier, which faces to said wafer.

3. The wafer polishing apparatus as defined in claim 1, wherein said plurality of air jetting holes connect to one another through air guide grooves formed in said surface of said carrier, which faces to said wafer.

4. The wafer polishing apparatus as defined in claim 1, wherein said plurality of air jetting holes connect to respective air guide grooves formed in said surface of said carrier, which faces to said wafer.

5. The wafer polishing apparatus according to claim 4, wherein the wafer has either of an orientation flat and an orientation notch, a minimum radius of the wafer being, respectively, a length of a perpendicular line extending from the orientation flat to the center of the wafer and a length of a line from the center of the orientation notch to the center of the wafer, wherein said air guide grooves are composed of a first air guide groove and a second air guide groove, said first air guide groove being formed along the inner circumference of a circle whose radius corresponds to the maximum radius of said wafer, and said second air guide groove being formed along the inner circumference of a circle whose radius corresponds to the minimum radius of said wafer.

6. The wafer polishing apparatus as defined in claim 5, wherein the minimum radius of said wafer corresponds to the length of said perpendicular line from the center of said wafer to said orientation flat formed in said wafer.

7. The wafer polishing apparatus as defined in claim 5, wherein the minimum radius of said wafer corresponds to the length of said line from the center of said wafer to said notch formed in said wafer.

8. The wafer polishing apparatus as defined in claim 5, wherein said first air guide groove and said second air guide groove are divided into a plurality of grooves, and said first air guide groove and said second air guide groove are formed alternately.

9. The wafer polishing apparatus as defined in claim 5, wherein a vacuuming part is formed inside said second air guide groove of said carrier to vacuum said wafer, and when said vacuuming part vacuums said wafer, the air is jetted from said air jetting holes to prevent the dust outside said carrier from entering a space between said vacuuming parts and said wafer.

10. The wafer polishing apparatus as defined in claim 1, wherein water jetting holes are formed in said carrier to jet water toward said wafer, the air jetted from said water jetting holes washing off slurry adhered to said wafer after polishing.

11. The wafer polishing apparatus as defined in claim 10, wherein said water jetting holes also serve as said air jetting holes.

12. The wafer polishing apparatus as defined in claim 1, wherein said air jetting holes connect with an air pump and a suction pump through a valve, and when an air pump side is opened and a suction pump side is closed with said valve, the air is jetted from said air jetting holes, and when the air pump side is closed and the suction pump side is opened with said valve, said air jetting holes function as air suction holes to vacuum and hold said wafer.

13. A wafer polishing apparatus comprising a carrier holding a wafer, pressing means for applying a pressure force to the carrier holding the wafer, a plurality of air jetting holes in the carrier holding the wafer, air from said plurality of air jetting holes forming a pressure air layer between said carrier and said wafer and transmitting said pressure force, that is transmitted to said carrier from said pressing means, directly to said wafer through said pressure air layer, thereby polishing said wafer by pressing the wafer against a polishing cloth, wherein:

said plurality of air jetting holes connect with a porous member provided in said carrier, said porous member being formed along the inner circumference of a circle whose radius corresponds to a radius of the wafer.

14. A wafer polishing apparatus which presses a wafer against a rotating polishing cloth to polish a surface of said wafer, said wafer polishing apparatus comprising:

a carrier for holding said wafer, a plurality of air jetting holes are formed at the outer periphery of said carrier, which faces to said wafer;

first pressing means for pressing said carrier against said polishing cloth;

pressure air layer forming means for jetting the air from said plurality of air jetting holes of said carrier to form a pressure air layer between said carrier and said wafer and transmitting a pressure force from said first pressing means to said wafer through said pressure air layer;

a retainer ring enclosing said wafer to prevent said wafer from springing out of said carrier;

a polished surface adjustment ring enclosing said wafer and coming into contact with said polishing cloth with said wafer;

second pressing means for pressing said retainer ring and said polished surface adjustment ring against said polishing cloth; and stock removal detecting means for detecting a stock removal of said wafer.

\* \* \* \* \*